(12) United States Patent
Fischer et al.

(10) Patent No.: US 7,760,529 B2
(45) Date of Patent: Jul. 20, 2010

(54) SYSTEMS AND METHODS FOR DIGITAL TRANSPORT OF PARAMAGNETIC PARTICLES ON MAGNETIC GARNET FILMS

(75) Inventors: Thomas Fischer, Tallahassee, FL (US); Pietro Tierno, Barcelona (ES); Lars Egil Helseth, Singapore (SG)

(73) Assignee: Florida State University Research Foundation, Tallahassee, FL (US)

(*) Notice: Subject to any disclaimer, the term of this patent is extended or adjusted under 35 U.S.C. 154(b) by 444 days.

(21) Appl. No.: 11/860,043

(22) Filed: Sep. 24, 2007

(65) Prior Publication Data

US 2008/0080222 A1    Apr. 3, 2008

Related U.S. Application Data

(60) Provisional application No. 60/827,904, filed on Oct. 3, 2006.

(51) Int. Cl.
*G11C 19/08* (2006.01)
(52) U.S. Cl. .............................. 365/35; 365/1; 365/18; 365/22; 365/23; 365/25; 365/31; 365/32; 365/33; 365/37; 365/39; 365/41; 365/44

(58) Field of Classification Search ................ 365/1, 365/35, 18, 22, 23, 25, 31, 32, 33, 37, 39, 365/41, 44
See application file for complete search history.

(56) References Cited

U.S. PATENT DOCUMENTS

| | | | | |
|---|---|---|---|---|
| 5,140,547 | A | * | 8/1992 | Osato et al. ................ 365/39 |
| 5,327,371 | A | * | 7/1994 | Maruyama et al. ............. 365/1 |
| 6,340,588 | B1 | * | 1/2002 | Nova et al. ................. 506/16 |
| 6,871,023 | B2 | * | 3/2005 | Atmur et al. ................ 398/152 |

* cited by examiner

*Primary Examiner*—Hoai V Ho
*Assistant Examiner*—Fernando N Hildago
(74) *Attorney, Agent, or Firm*—Sutherland Asbill & Brennan LLP

(57) ABSTRACT

Systems and methods are provided for digital transport of paramagnetic particles. The systems and methods may include providing a magnetic garnet film having a plurality of magnetic domain walls, disposing a liquid solution on a surface of the magnetic garnet film, wherein the liquid solution includes a plurality of paramagnetic particles, and applying an external field to transport at least a portion of the paramagnetic particles from a first magnetic domain wall to a second magnetic domain wall of the plurality of magnetic domain walls.

19 Claims, 8 Drawing Sheets

SYSTEMS AND METHODS FOR DIGITAL TRANSPORT OF PARAMAGNETIC PARTICLES ON MAGNETIC GARNET FILMS

RELATED APPLICATION

The present application claims priority to U.S. Provisional Application Ser. No. 60/827,904, filed Oct. 3, 2006, and entitled "Digital Transport of Paramagnetic Beads On Magnetic Garnet Films," which is hereby incorporated by reference in its entirety as if fully set forth herein.

FIELD OF THE INVENTION

Aspects of an embodiment of the invention relate generally to the programmable motion of an ensemble of paramagnetic particles on magnetic garnet films.

BACKGROUND OF THE INVENTION

Controlling the motion or transport of small particles and molecules on a film using external fields has been proven to be an extremely difficult task. Indeed, when external fields are applied to the particles and molecules, their resulting motions have tended to be random and unpredictable. Accordingly, random and unpredictable motions are not suitable for a variety of applications that require the ability to control the motion or transport of individualized particles and molecules in a deterministic manner. Accordingly, there is a need in the industry for systems and methods for the controlled motion or transport of small particles and/or molecules.

SUMMARY OF THE INVENTION

According to an example embodiment of the invention, there is a system for digital transport of paramagnetic particles. The system may include a magnetic garnet film having a plurality of magnetic domain walls, a liquid solution disposed on a surface of the magnetic garnet film, and a plurality of paramagnetic particles disposed within the liquid solution, where at least a portion of the paramagnetic particles are transported from a first magnetic domain wall to a second magnetic domain wall of the plurality of magnetic domains by applying an external field.

According to another example embodiment of the invention, there is a method for digital transport of paramagnetic particles. The method may include providing a magnetic garnet film having a plurality of magnetic domain walls, disposing a liquid solution on a surface of the magnetic garnet film, where the liquid solution includes a plurality of paramagnetic particles, and applying an external field to transport at least a portion of the paramagnetic particles from a first magnetic domain wall to a second magnetic domain wall of the plurality of magnetic domain walls.

According to yet another example embodiment of the invention, there is a system. The system may include a magnetic garnet film having a plurality of magnetic domain walls, a liquid solution disposed on a surface of the magnetic garnet film, a plurality of paramagnetic particles disposed within the liquid solution, and means for transporting at least a portion of the paramagnetic particles from a first magnetic domain wall to a second magnetic domain wall.

BRIEF DESCRIPTION OF THE SEVERAL VIEWS OF THE DRAWING(S)

Reference will be made to the accompanying drawings, which are not necessarily drawn to scale, and wherein.

DETAILED DESCRIPTION OF THE INVENTION

Embodiments of the invention will now be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide for paramagnetic particle transport systems that may allow for transporting or otherwise moving paramagnetic particles in a liquid solution in a deterministic manner. According to an embodiment of the invention, the paramagnetic particles may be utilized as carriers. More specifically, the paramagnetic particles may be used to transport cargo either directly or indirectly with the transported paramagnetic particles.

The transport or movement of the paramagnetic particles, with or without cargo, within a paramagnetic particle carrier system may be utilized for a variety of applications. Examples of such applications include memory devices, molecular shift registers, optical bar-coding, mixing of particles, particle separation, DNA sequencing, fluorescent markers (e.g., for use in microrheological experiments of the cytoskeleton), and microfluidics applications where cargo is to be transported on a lab-on-a-chip device. It will be appreciated that while some examples of applications have been listed above, other applications will be available without departing from embodiments of the invention.

I. Paramagnetic Particle Transport System Overview

Figure 1:
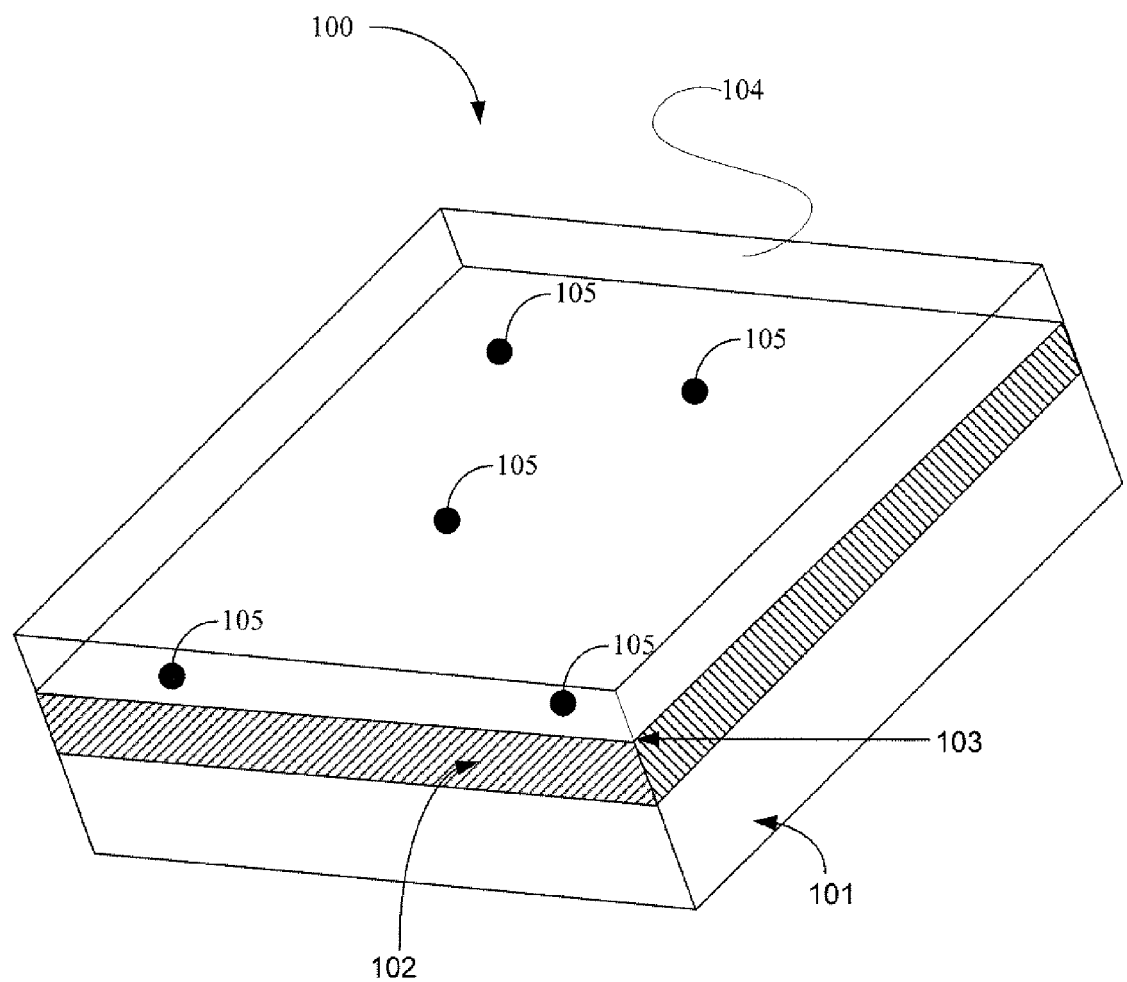
FIG. 1 illustrates a paramagnetic particle transport system according to an example embodiment of the invention.

FIG. 1 illustrates a paramagnetic particle transport system 100 according to an example embodiment of the invention. The paramagnetic particle transport system 100 of FIG. 1 may include a substrate 101, a garnet film 102 formed on the substrate 101, a liquid solution 104 formed on a surface of the garnet film 102, and one or more paramagnetic particles 105 disposed within the liquid solution 104 (e.g., an aqueous solution). Optionally, a barrier layer 103 may be provided as an electrostatic coating on the garnet film 102 to prevent one or more paramagnetic particles 105 from being absorbed by the garnet film 102. In an embodiment of the invention, the barrier layer 103 may be a polyelectrolyte, polysodium-4-styrene sulfonate, or the like.

The garnet film 102 may be formed on a surface of the substrate 101, according to an example embodiment of the invention. For example, the magnetized patterns of garnet films 102 may be grown by liquid-phase epitaxy on surfaces of a substrate 101 such as a gadolinium gallium garnet (GGG) substrate. Additionally, external magnetic fields, including high frequency magnetic fields, may be applied to the garnet film 102 to form metastable magnetization patterns as will be described in further detail below.

The paramagnetic particles 105 may be paramagnetic colloidal particles, paramagnetic nano particles, and the like, according to an example embodiment of the invention. According to an embodiment of the invention, the paramagnetic particles 105 may include a paramagnetic core made of superparamagnetic grains surrounded by a polymer shell. According to another embodiment of the invention, the paramagnetic particles 105 may be polystyrene particles doped with superparamagnetic iron oxide grains. These superparamagnetic iron oxide grains may range from 10 to 100 angstroms, according to an example embodiment of the invention. A type of paramagnetic particle 105 may be available from Dynal, Norway in sizes ranging from 0.5 to 5 microns in diameter. According to yet another embodiment of the invention, the paramagnetic particles 105 may include a polymer matrix that is doped with tiny superparamagnetic magnetite grains.

In the presence of a magnetic field, the paramagnetic particles 105 may become magnetized with their magnetostatic energy being proportional to the product of the magnetic field and the paramagnetic particle 105 magnetization. Accordingly, the paramagnetic particles 105 may be subject to a force pointing in the direction of the gradient of the square of the magnetic field, according to an example embodiment of the invention. Thus, the paramagnetic particles 105 may be capable of being manipulated by an external magnetic field. However, other paramagnetic particles 105 may be manipulated by other external fields, including electric and/or optical fields.

II. Magnetic Domains for Garnet Films

According to an example embodiment of the invention, the domain walls of the garnet film 102 (e.g., a ferrimagnetic garnet film) may generate magnetic fields heterogeneous on the colloidal scale. When a liquid solution 104 of the paramagnetic particles 105 is placed on the garnet film 102, the paramagnetic particles 105 may be pinned or constrained to the domain walls by the stray magnetic field of the garnet film 102. According to an example embodiment of the invention, an external field, perhaps an external magnetic field, may be applied to change the domain distribution in the garnet film 102 and thus move the paramagnetic particles 105 in a predetermined direction.

The paramagnetic particles 105 may be manipulated with the aid of non-invasive external fields, including magnetic fields, electric fields, and optical fields. According to an embodiment of the invention, the magnetic fields utilized for the paramagnetic particle transport system 100 may be generated and/or manipulated using magnetic tweezers, microcoil, micromagnetic systems, an array of permalloy elements, or electromagnetic traps. It will be appreciated however, that other embodiments of the invention, may instead utilize electric and optical external fields. For example, optical tweezers may be utilized for generating and/or manipulating optical fields.

According to an example embodiment of the invention, the garnet film 102 of the paramagnetic particle transport system 100 may include one of a variety of magnetic domain patterns. Generally, the magnetic domain patterns may determine the manner in which a paramagnetic particles 105, with or without cargo, may be transported across the garnet film 102. Some examples of magnetic domain patterns in accordance with example embodiments of the invention include (A) parallel stripe domains and (B) magnetic bubble domains. It will be appreciated, however, that other magnetic domain patterns may be available in accordance with other embodiments of the invention.

A. Parallel Stripe Domains

Figure 2:
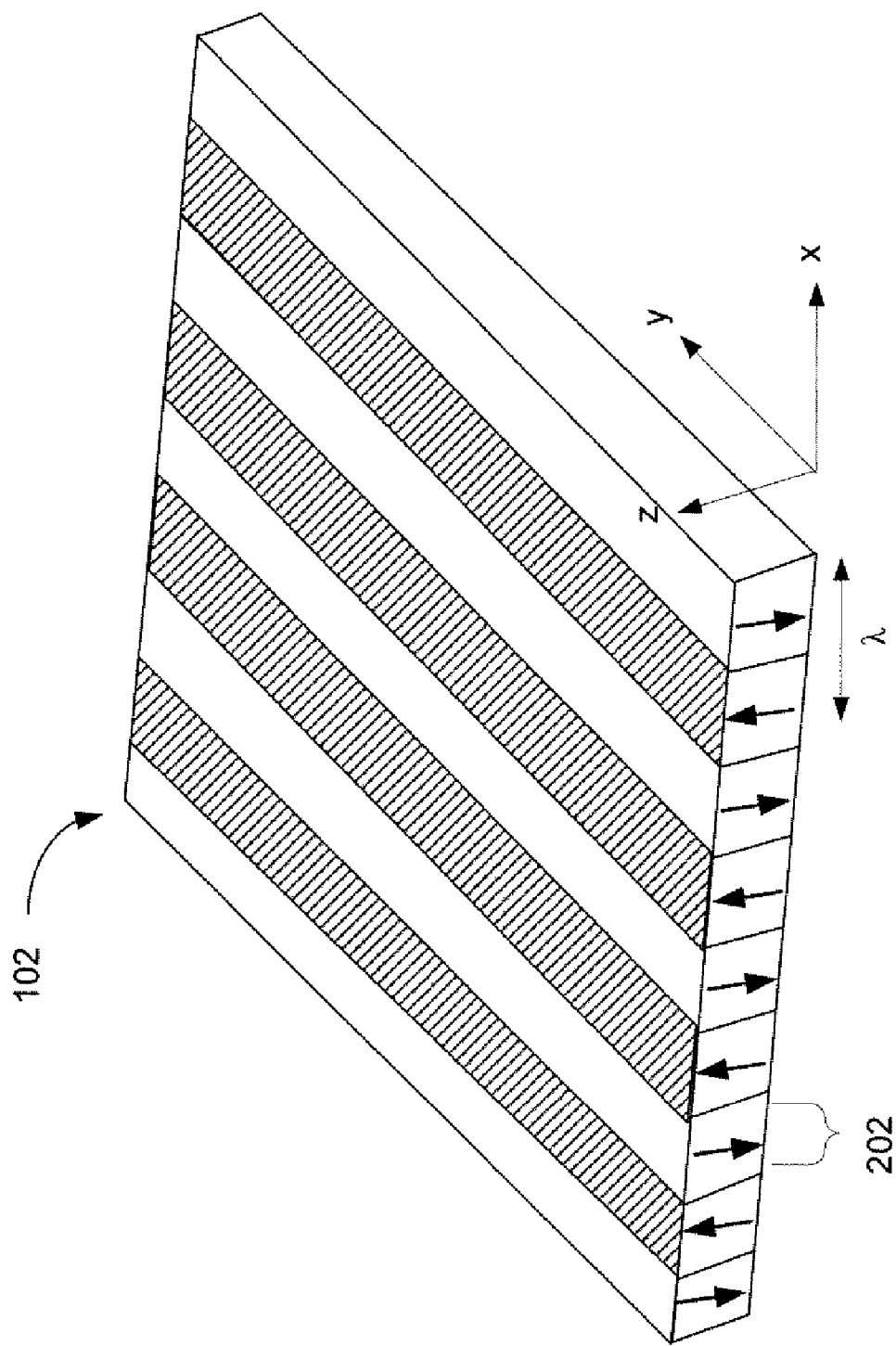
FIG. 2 illustrates example parallel stripe domains of a magnetic garnet film, according to an example embodiment of the invention.

FIG. 2 illustrates example parallel stripe domains 202 of a magnetic garnet film 102, according to an example embodiment of the invention. In FIG. 2, the magnetic stripe domain 202 walls are parallel to each other and alternate between opposing magnetic directions. It will be appreciated that application of an external magnetic field normal to the garnet film 102 may increase (decrease) the size the stripe domain 202 wall with parallel (anti-parallel) magnetization direction, according to an example embodiment of the invention. Accordingly, the application of an external, anti-parallel, normal magnetic field can be used to release and move paramagnetic particles 105 from one stripe domain 202 wall to another stripe domain 202 wall. It also be appreciated that the size of the paramagnetic particles 105 may determine the choice of wavelength $\lambda$ of the particular stripe pattern of the garnet film 102 to be used. In particular, the wavelength $\lambda$ of the particular stripe pattern of the garnet film 102 may be directly proportional to the size of the paramagnetic particles 105.

Figure 3A:
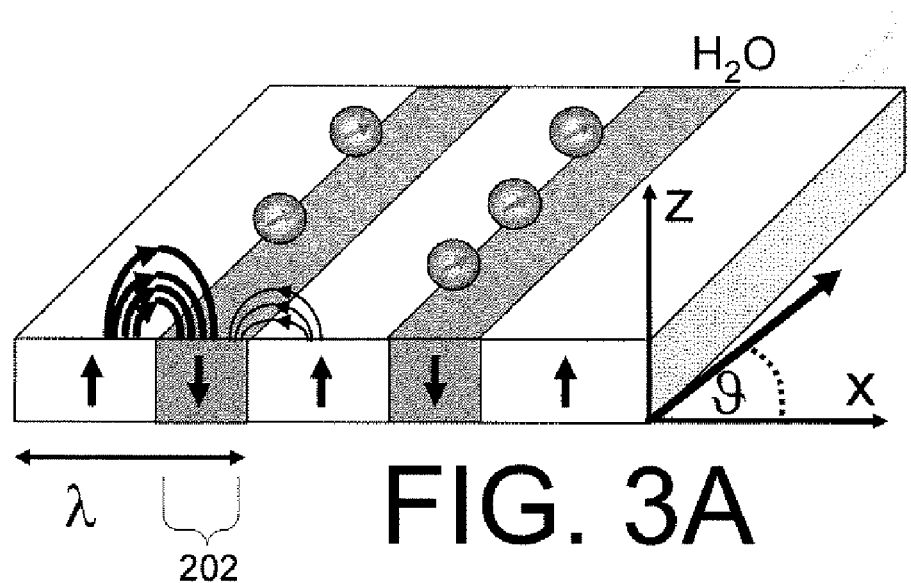
FIG. 3A illustrates the magnetic field at a magnetic domain wall prior to the application of oscillating magnetic field, according to an example embodiment of the invention.
Figure 3B:
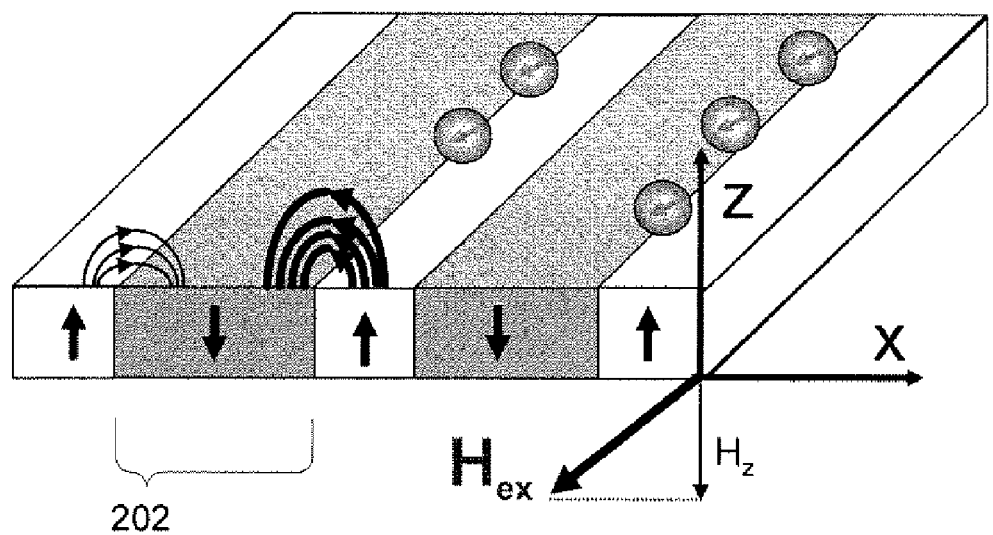
FIG. 3B illustrates the magnetic field at a magnetic domain wall during the application of a half cycle of a oscillating magnetic field pulse, according to an example embodiment of the invention.

According to an example embodiment of the invention, the parallel stripe domains 202 of FIG. 2 may be created using a uniaxial magnetic garnet film of composition $Y_{2.5}Bi_{0.5}Fe_{5-q}Ga_qO_{12}$ (q=0.5–1), thickness 5 μm, and saturation magnetization of $M_S=1.7\times10^4$ A/m. In this example embodiment, each stripe domain 202 wall may have a size of $\lambda/2$ where $\lambda=10.9$ μm is the wavelength of the stripe pattern. The paramagnetic particles 105 may have a mean diameter of 2.8±0.1 μm, density $\rho=1.4$ g/cm$^3$ and effective magnetic susceptibility $\chi=0.17$ (e.g., Dynabeads M-270), according to an example embodiment of the invention. To move the paramagnetic particle 105 in a defined direction, oscillating magnetic field pulses in the (x,z) plane, $H_{ext}=\hat{H}(\sin \omega t, 0, \cos \omega t)$ may be applied with frequency 6 s$^{-1}$<$\omega$<125 s$^{-1}$ (e.g., $\omega=18.8$ s$^{-1}$), amplitude $\hat{H}=1.3\times10^4$ A/m, and inclination $\theta=45°$ with respect to the z axis. The component of the field normal to the garnet film 102 may displace the domain wall by increasing the width of the stripe domains 202 having parallel magnetization direction. Colloidal particles 105 hopping across the stripe domains 202 walls may occur because the pinning sites alternate between weak and strong during the magnetic modulation of the planar component of the magnetic field, as illustrated in FIGS. 3A and 3B. In particular, FIG. 3A illustrates the magnetic field at the domain 202 wall prior to the application of oscillating magnetic field pulse while FIG. 3B illustrates the magnetic field at the domain 202 wall during the application of a half cycle of a oscillating magnetic field pulse. Accordingly, as illustrated by FIG. 3B, the paramagnetic particle 105 motion may be directed normal to the stripe domain 202 pattern and the paramagnetic particles 105 may move by one wavelength λ during one magnetic field pulse cycle. The hopping from one to the next domain 202 wall renders the longitudinal motion free of dispersion. Individual differences in speed due to different drag coefficients may be erased after each hop. This may ensure that the paramagnetic particles 105 do not separate along the direction of motion, and they all move with a defined speed, $v_p = \lambda \omega / 2\pi$.

The magnetic garnet film 102 of FIG. 2 having parallel stripe domains 202 may be utilized in a variety of applications, including memory and computing applications. In particular, in accordance with an embodiment of the invention, the paramagnetic particles 105 in the liquid solution 104 may be transported in digital steps on the surface of a garnet film from one stripe domain 202 wall to another stripe domain 202 wall. Additionally, these paramagnetic particles 105 may be loaded with single molecules to form, for example, shift registers, libraries, memory devices, and computing devices.

B. Magnetic Bubble Domains

Figure 4:
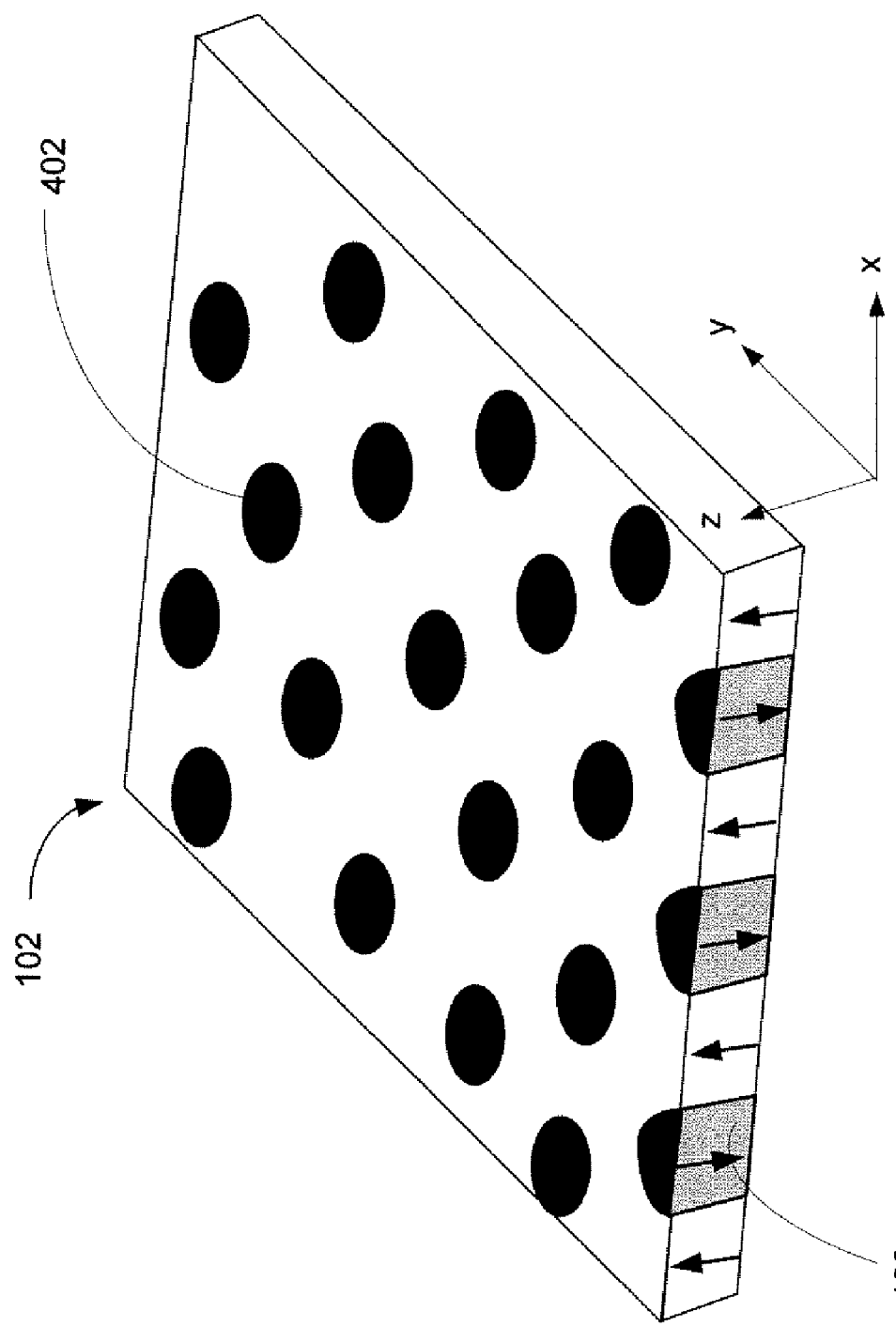
FIG. 4 illustrates a periodic array of magnetic bubble domains of a magnetic garnet film, according to an example embodiment of the invention.

FIG. 4 illustrates a periodic array of magnetic bubble domains 402 of a magnetic garnet film 102, according to an example embodiment of the invention. These magnetic bubble domains 402 may be achieved by applying a high frequency magnetic field to the garnet film 102. According to an embodiment of the invention, the magnetic bubble domains 402 may be metastable in that they may be maintained, at least temporarily, after the high frequency magnetic field is removed. Accordingly, the magnetic garnet films 102 may include circular spots that form a periodic array of magnetic bubble domains 402.

Figure 5A:
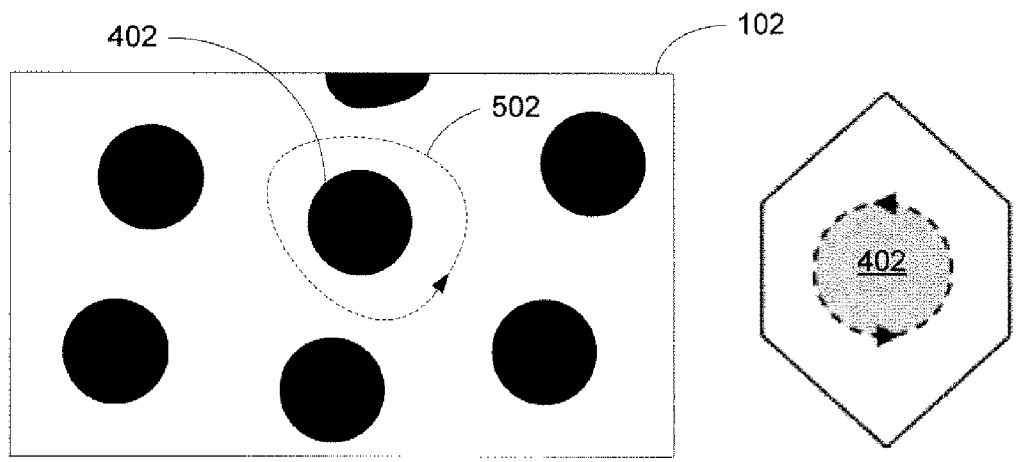
FIG. 5A illustrates a paramagnetic particle trapped in a localized orbit around a single bubble domain, according to an example embodiment of the invention.
Figure 5B:
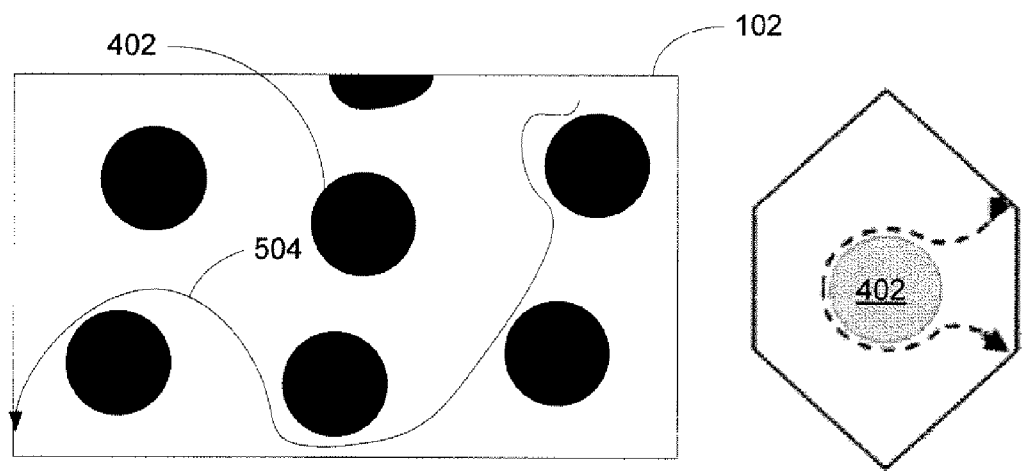
FIG. 5B illustrates a paramagnetic particle moving in a superdiffusive manner, according to an example embodiment of the invention.
Figure 5C:
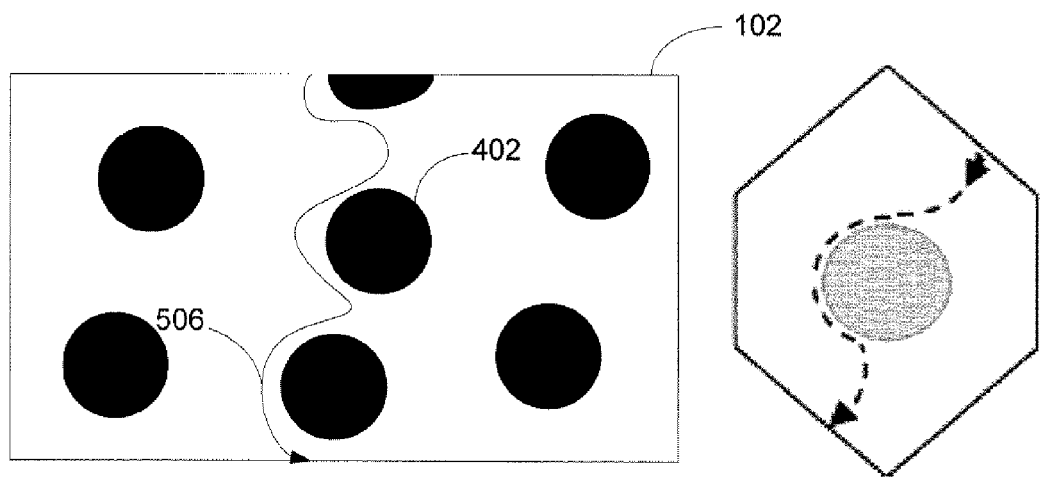
FIG. 5C illustrates a paramagnetic particle moving in a ballistic manner, according to an example embodiment of the invention.
Figure 5D:
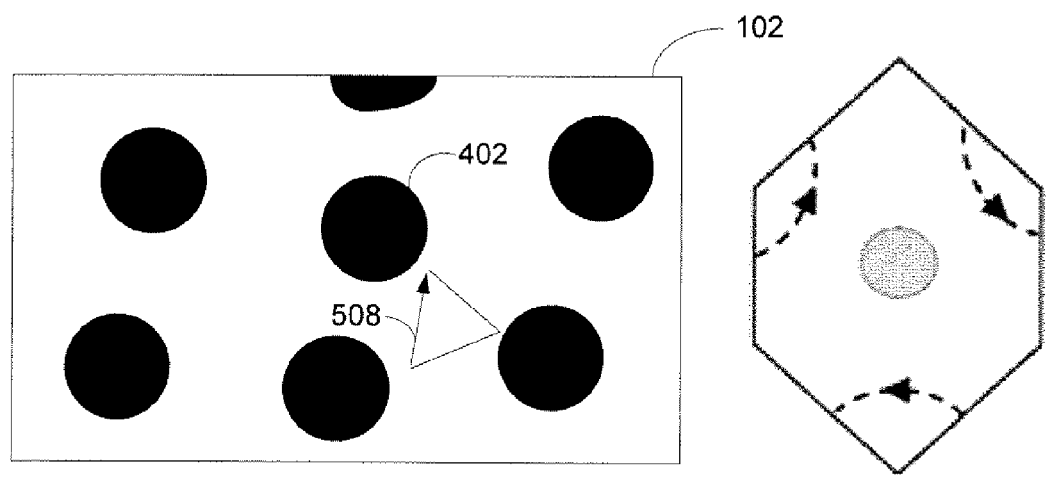
FIG. 5D illustrates a trapped paramagnetic particle between neighboring bubble domains, according to an example embodiment of the invention.

Prior to the application of an external field, perhaps an external magnetic field, a paramagnetic particle 105 may be trapped by a stray magnetic field provided by a magnetic bubble domain 402. Indeed, according to an example embodiment, the paramagnetic particle 105 may be trapped in a localized orbit 502 around a single bubble domain 402 wall, as illustrated by FIG. 5A. As an increasing external static field is applied normal to the garnet film 102, the paramagnetic particle 105 may break its localized orbit 502 around a single bubble domain 402 wall, and instead move in a superdiffusive manner 504, as illustrated in FIG. 5B, or further in a ballistic motion, as illustrated in FIG. 5C. In particular, with the superdiffusive motion 506 of FIG. 5B, the paramagnetic particle 105 may meander towards the desired direction. However, with the ballistic motion 506 of FIG. 5C, the paramagnetic particle 105 may move along a substantially straight sequence of bubble domains 402 walls with a symmetry broken direction of motion that may be decided by the relative phase of the paramagnetic particle 105 with respect to the external field modulation. According to an embodiment of the invention, the application of an even higher external static field normal to the garnet film 102 may trap a paramagnetic particle 105 in an orbit 508 around a continuous domain area in between three neighboring bubble domain 402 walls.

According to an example embodiment of the invention, the magnetic bubble domains 402 of FIG. 4 may be created using a garnet film 102, perhaps a ferrite garnet film, with uniaxial anisotropy and composition $Y_{2.5}Bi_{0.5}Fe_{5-q}Ga_qO_{12}$ (q=0.5–1), thickness ~5 μm and saturation magnetization $M_s = 1.7 \times 10^4$ A/m. High frequency (e.g., ~$12 \times 10^3$ s$^{-1}$) magnetic field pulses of amplitude ~$10^5$ A/m normal to the garnet film 102 may enforce the formation of the metastable magnetic bubble inside the garnet film 102, according to an example embodiment of the invention. The bubbles may be cylindrical domains 402, perhaps with diameter 2R=8.2±0.1 μm, of reverse magnetization separated by a continuous magnetized film 102. Application of an external magnetic field Hz parallel (antiparallel) to the bubble magnetization direction may increase (decrease) the size of the cylindrical domain 402 walls. The colloidal suspension may consist of paramagnetic particles 105 (e.g., polystyrene paramagnetic particles) with a diameter D=2.8 μm and magnetic susceptibility χ=0.17 (e.g., Dynabeads M-270).

According to an example embodiment of the invention, with a magnetic field H, a paramagnetic particle 105 of volume V may acquire a magnetic moment $m = V \chi H$ along the field. The magnetic energy of the paramagnetic particle 105 may be $E = -\mu m \cdot H \propto H^2$, where μ is the magnetic susceptibility of the liquid solution 104 (e.g., water). Without an external field, the paramagnetic particles 105 may be attracted toward the bubble domain 402 walls, where the magnetic stray field of the film 102 may be maximal. If ignoring the field of the neighboring magnetic bubble domains 402, the magnetic stray field may have cylindrical symmetry and each paramagnetic particle 105 position on the bubble domain 402 boundary may have the same energy. This symmetry may be broken with an external field by using a precessing magnetic field of frequency Ω and θ:

$H = \hat{H}[\cos \theta e_z + \sin \theta (\cos(\Omega t) e_x + \sin(\Omega t) e_y)]$. This external field, when averaged over one period of the modulation, may have no preferred direction and motion into a particular direction can only be achieved via symmetry breaking for the individual paramagnetic particles 105, thereby releasing the paramagnetic particles 105. Accordingly, the paramagnetic particles 105 when released may then move in a superdiffusive motion 504 or in a ballistic motion 506, according to an example embodiment of the invention.

C. Other Magnetic Domains

Figure 6:
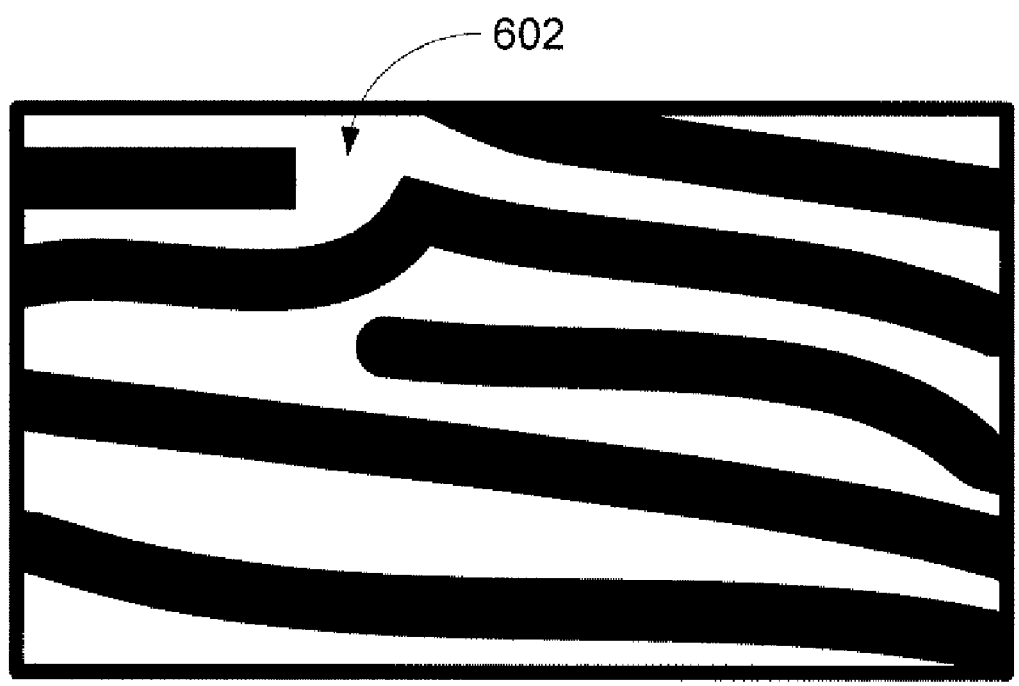
FIG. 6 illustrates a top view of an example magnetic labyrinth pattern of a garnet film, according to an example embodiment of the invention.

The magnetic garnet films 102 may alternatively be provided with magnetic domain patterns other than the stripe domain patterns or bubble domain patterns described above. For example, the stripe domain pattern of FIG. 2 may be altered using strong magnetic fields to form a magnetic labyrinth pattern. FIG. 6 illustrates a top view of an example magnetic labyrinth pattern of a garnet film 102, according to an example embodiment of the invention. As illustrated by FIG. 6, the magnetic labyrinth pattern forms channels 602 that define flow directions for paramagnetic particles 105.

III. Applications

A. Transport of Cargo

Figure 7A:
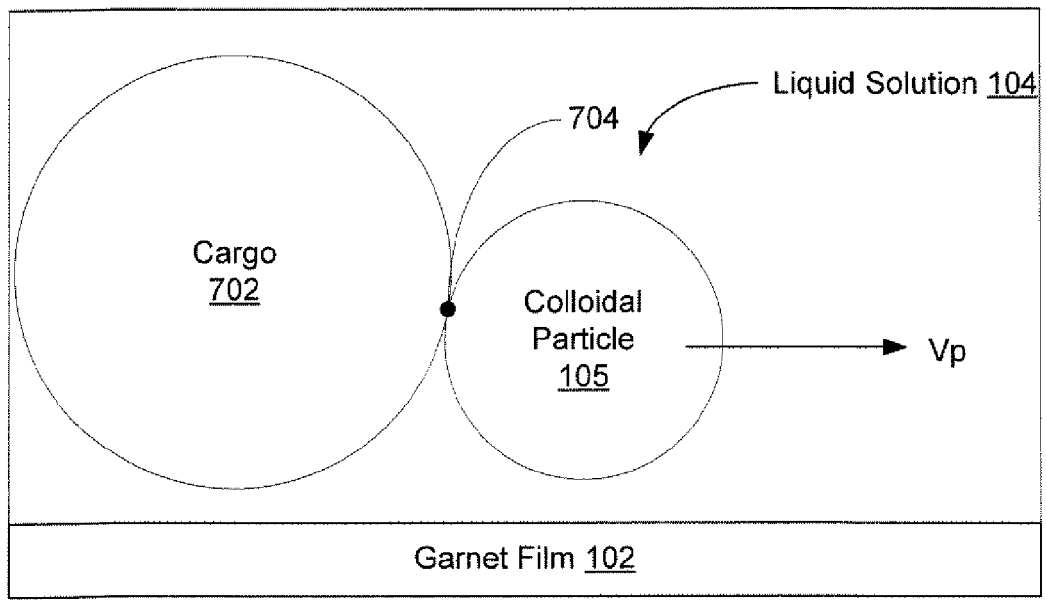
FIG. 7A illustrates a type of paramagnetic particle carrier where the paramagnetic particles may be adhered, at least temporarily, to a variety of cargo, according to an example embodiment of the invention.
Figure 7B:
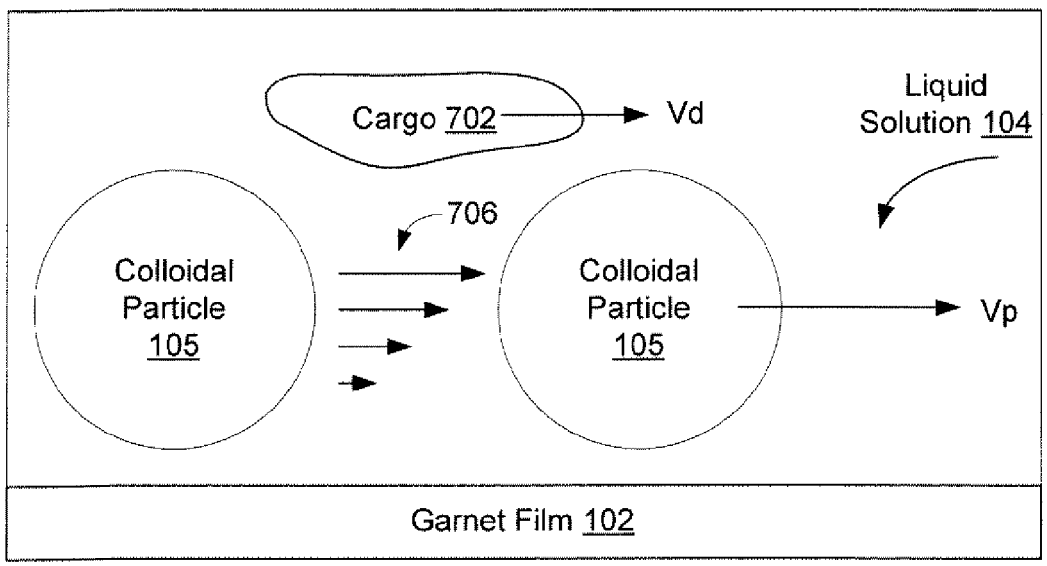
FIG. 7B illustrates a motion of the paramagnetic particles that may provide secondary flow to transport cargo, according to an example embodiment of the invention.

The paramagnetic particles 105 in accordance with an embodiment of the invention may serve as carriers. FIG. 7A illustrates a type of carrier where the paramagnetic particles 105 may be adhered, at least temporarily, to a variety of cargo 702. Indeed, the paramagnetic particles 105 may include adhesives or surface reactive groups 704 to adhere the paramagnetic particles 105 to a variety of cargo 702. Thus, both the paramagnetic particles 105 and the attached cargo 702 may be transported at the same speed Vp.

According to another embodiment of the invention, FIG. 73 illustrates a motion of the paramagnetic particles 105 that may provide secondary flow 706 to transport the cargo 702. The secondary flow 706 may drag the cargo 702 in the same direction as the transported paramagnetic particles 105. In this embodiment of the invention, a sufficient number of paramagnetic particles 105 may be needed to create sufficient secondary flow 706. The paramagnetic particles 105 may be transported at particle speed Vp while the cargo 702 may be transported at cargo speed Vd. In an example embodiment of the invention, the cargo speed Vd may be less than or equal to the particle speed Vp. For example, the cargo speed Vd may be only half of the particle speed Vp.

In either embodiment, the cargo 702 may include one or more molecules or particles, including, but not limited to, nucleic acids (e.g., DNA), cells such as biological cells, chemicals, and polymer molecules. It will be appreciated that the transport of cargo may be achieved using any of the magnetic domain patterns described in FIGS. 2, 4, and 6, as well as a yet other magnetic domain patterns.

B. Mixing

According to an embodiment of the invention, the garnet film 102 of FIG. 4 having an array of bubble domains 402 may be utilized in a paramagnetic particle transport system 100 that operates as a mixer. Generally, external magnetic field gradients may be used to move paramagnetic particles 105 in a liquid solution 104, and thus drag or mix small volumes of reactants. According to an embodiment of the invention, the orbit of paramagnetic particles 105 around a bubble domain 402 in either direction (e.g., clockwise, counterclockwise) may be operative to mix these reactants.

C. Digital Particle Separation

According to an embodiment of the invention, the paramagnetic particle transport system 100 using the garnet films 102 of FIG. 2 or 4 may be operative to digitally separate paramagnetic particles 105, including those that may include cargo 702. Generally, the trapping force may depend on the distance of the paramagnetic particle 105 from the domain wall. Thus, smaller paramagnetic particles 105 with their center close to a domain wall may be trapped stronger than larger particles 105 that are on average farther away from the wall. According to an embodiment of the invention, paramagnetic particles 105 of different sizes may be separated by applying an external field too weak to move the smaller particles but large enough for the large particles. According to another embodiment of the invention, an external field modulation may be applied to carry the smaller paramagnetic particles 105 in one direction and the larger particles 105 in an opposite direction. For example a modulation of the form $(Hx, Hz)=\hat{H}(\sin 3\omega t, \sin \omega t)$ may create a motion where the large particles hop two steps (e.g., domain walls) to the right while the smaller particles remain at their domain current wall. When the magnetic field amplitude reaches its maximum value the in-plane field changes sign and both large and small paramagnetic particles 105 may hop left. The net motion may be that the large paramagnetic particles 105 may move to the right while the small paramagnetic particles 105 may move to the left. Accordingly, the larger paramagnetic particles 105 may be separated from the smaller paramagnetic particles 105.

D. Shift Registers

According to an example embodiment of the invention, the garnet film 102 of FIG. 2 may be used to implement a molecular shift register that may include paramagnetic particles 105 disposed on top of the magnetic domain walls in the magnetic garnet film 102 having the magnetic stripe pattern of FIG. 2 or another magnetic pattern. In the absence of external magnetic fields, this configuration provides a non-volatile form of data storage at a definite position. In accordance with an embodiment of the present invention, simple time dependent magnetic pulses may shift the entire assembly of paramagnetic particles 105 by one period of the magnetic domain pattern. Single molecules attached to the particles may be address in this way and may be moved sequentially into a desired region where they may be analyzed. Since the motion is digital—that is, one magnetic period per pulse, there is no dispersion of the particles as they move along the path such that the order of the paramagnetic particles 105 may be conserved. Accordingly, there is no loss of data.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A system for digital transport of paramagnetic particles, comprising:
   a magnetic garnet film having a plurality of magnetic domain walls;
   a liquid solution disposed on a surface of the magnetic garnet film; and
   a plurality of paramagnetic particles disposed within the liquid solution, wherein at least a portion of the paramagnetic particles are transported from a first magnetic domain wall to a second magnetic domain wall of the plurality of magnetic domain walls by applying an external field,
   wherein the transported portion of the paramagnetic particles serve as carriers of cargo.

2. The system of claim 1, wherein the paramagnetic particles serve as carriers of the cargo by (i) inducing a secondary flow in the liquid solution for transporting the cargo, or (ii) binding to the cargo.

3. The system of claim 1, wherein the external field is (i) an external magnetic field, or (ii) an external optical field, or (iii) an external electric field.

4. The system of claim 3, wherein the external field is the external magnetic field and wherein at least a portion of the external magnetic field that is normal to the garnet film is antiparallel to a magnetic field of the first magnetic domain.

5. The system of claim 1, wherein the paramagnetic particles are transported from the first magnetic domain wall to the second magnetic domain wall using a diffusive motion or a ballistic motion.

6. The system of claim 1, wherein the magnetic domains walls are associated with (i) parallel stripe domain walls or (ii) magnetic bubble domain walls.

7. The system of claim 1, wherein the liquid solution is an aqueous solution.

8. The system of claim 1, further comprising a barrier layer disposed between the magnetic garnet film and the liquid solution.

9. The system of claim 1, wherein at least a portion of the paramagnetic particles comprise one or more of the following (i) a superparamagetic cores surrounded by a polymer layer, (ii) a paramagnetic colloidal particle, (iii) or a paramagnetic nano particle.

10. The method of claim 1, wherein the magnetic domains walls are associated with (i) parallel stripe domain walls or (ii) magnetic bubble domain walls.

11. The method of claim 1, wherein disposing the liquid solution on the surface of the magnetic garnet film includes disposing an aqueous solution.

12. The method of claim 1, further comprising a providing a barrier layer between the magnetic garnet film and the liquid solution.

13. The method of claim 1, wherein at least a portion of the paramagnetic particles comprise one or more of the following (i) a superparamagetic core surrounded by a polymer layer, (ii) a paramagnetic colloidal particle, (iii) or a paramagnetic nano particle.

14. A method for digital transport of paramagnetic particles, comprising:
- providing a magnetic garnet film having a plurality of magnetic domain walls;
- disposing a liquid solution on a surface of the magnetic garnet film, wherein the liquid solution includes a plurality of paramagnetic particles; and
- applying an external field to transport at least a portion of the paramagnetic particles from a first magnetic domain wall to a second magnetic domain wall of the plurality of magnetic domain walls,
- wherein the transported portion of the paramagnetic particles serve as carriers of cargo.

15. The method of claim 14, wherein the paramagnetic particles serve as carriers of the cargo by (i) inducing a secondary flow in the liquid solution for transporting the cargo, or (ii) binding to the cargo.

16. The method of claim 14, wherein applying the external field includes applying (i) an external magnetic field, or (ii) an external optical field, or (iii) an external electric field.

17. The method of claim 16, wherein applying the external field includes applying the external magnetic field, and wherein at least a portion of the external magnetic field that is normal to the garnet film is antiparallel to a magnetic field of the first magnetic domain.

18. The method of claim 14, wherein the paramagnetic particles are transported from the first magnetic domain wall to the second magnetic domain wall using diffusive motion or ballistic motion.

19. A system, comprising:
- a magnetic garnet film having a plurality of magnetic domain walls;
- a liquid solution disposed on a surface of the magnetic garnet film;
- a plurality of paramagnetic particles disposed within the liquid solution; and
- means for transporting at least a portion of the paramagnetic particles from a first magnetic domain wall to a second magnetic domain wall,
- wherein the transported portion of the paramagnetic particles serve as carriers of cargo.

* * * * *